US007930605B2

(12) United States Patent
Bancel et al.

(10) Patent No.: US 7,930,605 B2
(45) Date of Patent: Apr. 19, 2011

(54) ELECTRONIC CIRCUIT COMPRISING A TEST MODE SECURED BY INSERTION OF DECOY DATA IN THE TEST CHAIN, ASSOCIATED METHOD

(75) Inventors: Frédéric Bancel, Lamanon (FR); David Hely, Marseilles (FR)

(73) Assignee: STMicroelectronics SA, Montrouge (FR)

( * ) Notice: Subject to any disclaimer, the term of this patent is extended or adjusted under 35 U.S.C. 154(b) by 955 days.

(21) Appl. No.: 11/774,344

(22) Filed: Jul. 6, 2007

(65) Prior Publication Data

US 2008/0022174 A1     Jan. 24, 2008

(30) Foreign Application Priority Data

Jul. 7, 2006     (FR) ...................................... 06 06193

(51) Int. Cl.
*G06F 11/00*     (2006.01)
*G01R 31/28*     (2006.01)
(52) U.S. Cl. ....................................... 714/726; 714/703
(58) Field of Classification Search .................. 714/726, 714/727, 728, 729, 724, 703
See application file for complete search history.

(56) References Cited

U.S. PATENT DOCUMENTS

| 5,574,733 A | * | 11/1996 | Kim ............................... 714/728 |
| 2003/0204801 A1 | | 10/2003 | Tkacik et al. .................. 714/726 |
| 2008/0148118 A1 | * | 6/2008 | Morgan et al. ................. 714/726 |

FOREIGN PATENT DOCUMENTS

EP     1560033     8/2005

OTHER PUBLICATIONS

Hely et al., Test Control for Secure Scan Designs, Test Symposium, European Tallinn, Estonia, May 22, 2005; pp. 190-195.

* cited by examiner

*Primary Examiner* — Cynthia Britt
*Assistant Examiner* — Daniel F McMahon
(74) *Attorney, Agent, or Firm* — Lisa K. Jorgenson; Allen, Dyer, Doppelt, Milbrath & Gilchrist, P.A.

(57) ABSTRACT

An electronic circuit includes configurable cells each having a test input and an output. The configurable cells are connected to one another in a chain in a predefined order via their test input and their output to form a test register based on receiving a chaining command signal. The electronic circuit also includes a detection circuit activated by the chaining command signal to produce a state signal representing a state of initialization of a first set of configurable cells A multiplexing circuit selectively connects the test input of each configurable cell to a second set of the configurable cells either to the output of a preceding configurable cell or to an output of a decoy data generator based on the state signal.

23 Claims, 2 Drawing Sheets

US 7,930,605 B2

ELECTRONIC CIRCUIT COMPRISING A TEST MODE SECURED BY INSERTION OF DECOY DATA IN THE TEST CHAIN, ASSOCIATED METHOD

FIELD OF THE INVENTION

The invention relates to synchronous electronic integrated circuits provided with combinatorial logic circuits, flip-flop circuits and test circuits.

More specifically, the invention relates to an electronic circuit comprising configurable cells, with each cell comprising a test input and an output. The configurable cells are connected to one another in a chain to form a test register based on receiving a chaining command signal indicating a test mode for the electronic circuit.

BACKGROUND OF THE INVENTION

The configurable cells further comprise functional inputs, and when they do not receive a chaining command signal, the configurable cells are connected by their functional inputs and their outputs to logic cells with which they cooperate to form one or more logic circuits of the electronic circuit. This is a standard operating mode of the electronic circuit.

There are well-known procedures for verifying that the functional elements of an integrated circuit are working properly. These procedures entail the dictating and/or determining, at predefined points in time, of data values present at certain internal points of the integrated circuit.

A technique of this kind for testing internal test paths of an integrated circuit (called a scanpath or an internal scan method) is described for example by M. Williams and J. Angel, in "Enhancing Testability of LSI Circuits Via Test Points and Additional Logic," IEEE Transactions on Computers, vol. C22, No. 1; January 1973. This technique and its advantages and drawbacks are also described in detail in European patent application no. 1,560,033, particularly paragraphs 2 to 16. The European patent application is assigned to the current assignee of the present invention, and is incorporated herein by reference in its entirety.

In addition to the internal scan method, the European patent application also describes an electronic circuit protected against fraud aimed at extracting data from the configurable cells. In the European patent application, when a change in the mode of operation is desired, the configurable cells are reset and a verification is made that they are properly reset before authorizing the change.

A drawback of this circuit is that any fraudulent person immediately realizes that the circuit is protected, and more specifically, realizes this as soon as they ask for a change in the mode. A fraudulent individual, whose obvious goal is to extract data from the test register, immediately realizes that the test register does not contain information. Since the cells are reset with the effective change in the mode, the data likely to be extracted is identical at each change in the mode.

The efficiency of a procedure for protecting an electronic circuit is particularly measured by taking into account the time that a possible fraudulent individual will take to determine that protection exists before seeking a way to circumvent the protection.

SUMMARY OF THE INVENTION

In view of the foregoing background, an object is to improve the electronic circuit as disclosed in the European patent application.

This and other objects, advantages and features are provided by an electronic circuit that is protected but whose protection is not immediately detectable. The electronic circuit comprises configurable cells each comprising a test input and an output. The configurable cells may be capable of being connected to one another in a chain in a predefined order by their test input and their output to form a test register if they receive a chaining command signal SCAN_ENABLE.

The electronic circuit may further comprise a detection circuit to produce a state signal representing a state of initialization of a first set of configurable cells, and a multiplexing circuit. The multiplexing circuit may be for the selective connection of the test input of each configurable cell of a second set of configurable cells either to the output of a preceding configurable cell, or to an output of a decoy data generator depending on the state signal.

Decoy data is data that is irrelevant to the circuit. Decoy data is not representative of the internal data contained in the circuit (such as the data stored in the memories of the circuit) or produced by the circuit (such as the data obtained by a combination of the internal and external data input by an authorized user of the circuit). Decoy data cannot be used to obtain information on the internal data of the circuit.

If the cells of the first set of configurable cells are not in an initial state, the formation of the test register is authorized (activated by the chaining command signal) but the decoy data is propagated in the register instead of the data contained in the cells that are not properly reset. Thus, any fraudulent individual may extract data from the test register, but none of this data or only a part of this data is relevant because it is decoy data.

In one variation, the decoy data generator may be a random number generator. In another variation, the decoy data generator may be adapted to producing decoy data as a function of the contents of the configurable cells, and possibly as a function of a key associated, for example, with the electronic circuit or with an authorized user of the electronic circuit. The choice of the embodiment of the decoy data generator depends on the security to be obtained for the circuit.

The circuit may further comprise a control circuit such as a TAP controller to produce the command signals needed for reading in the test register and writing to the test register, especially the chaining command signal and the data propagation signal. However, these signals may also be produced by a TAP controller that is external the electronic circuit. The TAP controller may be connected to the input/output interface of the electronic circuit. If the tap controller is internal to the electronic circuit, it may include the detection circuit and the decoy data generator.

Another aspect is directed to a chip card or a smart card comprising an electronic circuit as described above.

Yet another aspect is directed to a method for securing an electronic circuit as described above. The method comprises a chaining step for setting up, when a chaining command signal is applied to a chaining command input of the configurable cells, a connection of the configurable cells to one another in a predefined order by way of their test input and their output to form a test register. The method may further comprise a data propagation step for the input and/or output of the contents of the configurable cells when a periodic data propagation command signal is applied to a data propagation command input of the configurable cells.

The electronic circuit in accordance with the invention can be distinguished from prior art methods in that it also comprises the following steps. A detection step for the production of a state signal representing a state of initialization of a first set of configurable cells. A switching step for the connection of the test input of each configurable cell of a second set of configurable cells to an output of a decoy data generator as a function of the state signal. The switching step may be executed in parallel with the propagation step during one or more periods of the data propagation signal, and then a new chaining step is performed.

BRIEF DESCRIPTION OF THE DRAWINGS

The invention will be understood more clearly and other features and advantages shall appear from the following description of examples of implementation of an electronic circuit according to the invention. The description, given by way of an indication that in no way restricts the scope of the invention, is made with reference to the appended drawings of which.

DETAILED DESCRIPTION OF THE PREFERRED EMBODIMENTS

Figure 1:
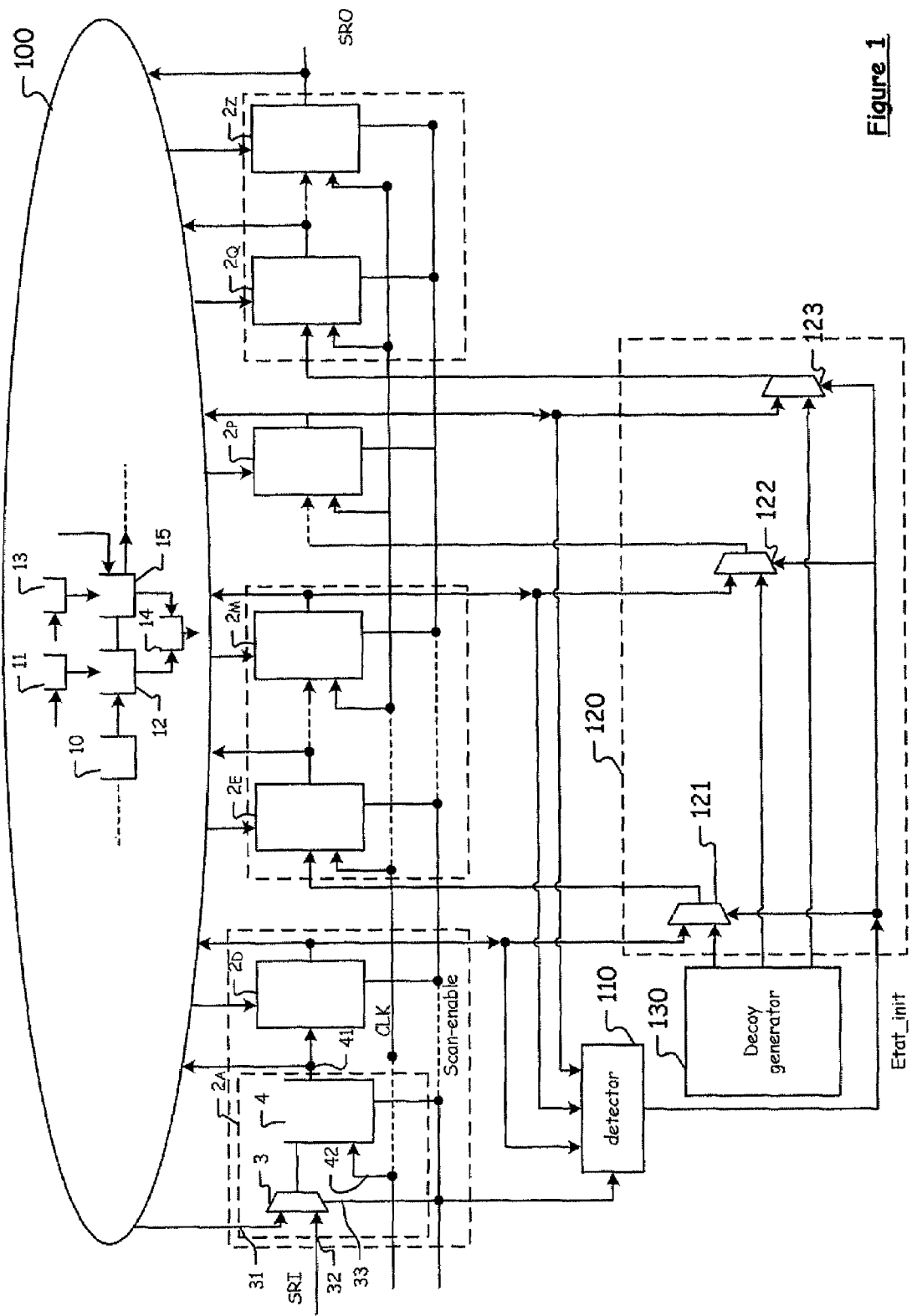
FIG. 1 is a block diagram of a first embodiment of the circuit according to the invention.
Figure 2:
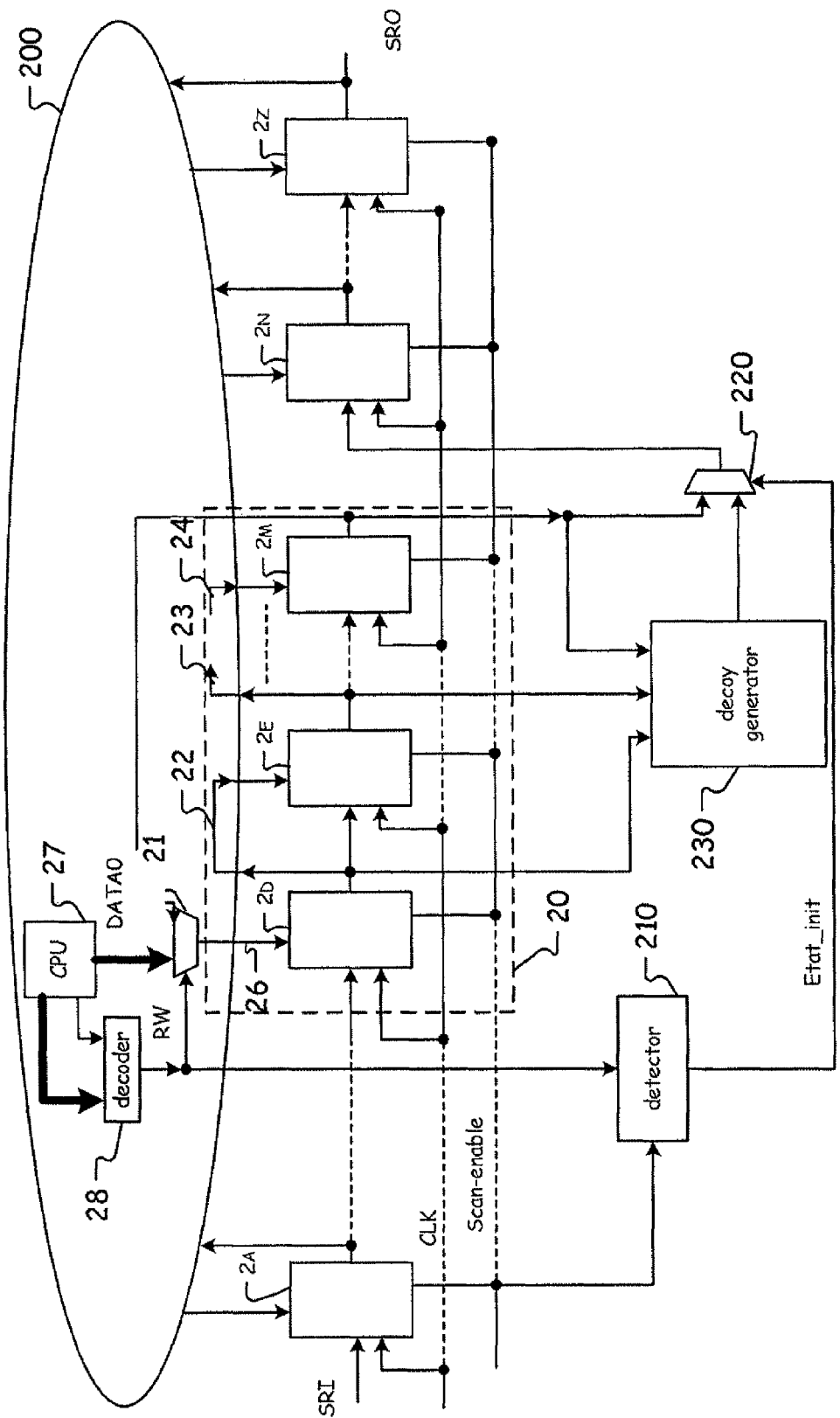
FIG. 2 is a block diagram of a second embodiment of a circuit according to the invention.

FIGS. 1 and 2 illustrate two examples of the electronic circuit. The circuit of FIG. 1 is an integrated circuit comprising a logic circuit 100 comprising a plurality of logic cells 10 to 15. The circuit i also has configurable cells 2a, . . . , 2d, 2e, 2m, . . . , 2q, . . . , 2z, capable of being connected to the logic cells 10 to 15 to form at least one functional circuit (such as a shift register, state machine, etc.), capable of being connected to one another to form a test shift register. They are also capable of receiving control signals, especially a chaining command signal SCAN_ENABLE and a data propagation signal CLK to write data to the configurable cells or to read data in these cells.

In the more concrete example of FIG. 2, the logic circuit 200 comprises a multiplexer 21 and linking means or connections 22, 23, 24, 25, 26 laid out so that, in the standard operating mode of the electronic device, when the signal SCAN_ENABLE is inactive, the configurable cells 2d, 2e to 2m and the multiplexer 21 form an internal shift register 20. The internal shift register 20 comprises an output (formed by the output of the cell 2m) looped back to a data input (formed by a first data input of the multiplexer 21). The circuit 200 also has a control unit (CPU) 27 and an address decoder 28 for the write and read control in the internal register 20.

The multiplexer 21 has a first input connected to the output of the cell 2m, a second input connected to a data output of the control unit 27, a control input connected to an output of the address decoder 28, and an output connected to the functional input of the cell 2d. The decoder 28 produces a write signal (RW active) or read signal (RW inactive) for the selection of the first input or the second input of the multiplexer 21.

To reset the register 20, the decoder produces an active signal RW (to control an operation of writing to the register) and the control unit 27 applies initial data DATA0 to the second input of the multiplexer 21. The internal register 20 is an element of the functional circuit 200 controllable by the control unit 27, and is capable of containing sensitive data.

The serial input register of FIG. 2 is only an example. The embodiment shown in FIG. 2 can be applied to any type of register, and can be applied more generally to any first set of configurable cells in which the cells, when they do not receive the chaining command signal SCAN_ENABLE, are connected to logic cells with which they co-operate to form a logic circuit. The logic circuit is capable of being reset by an initialization signal that can be exploited by the detection circuit, as will be discussed more clearly below.

The configurable cells are known per se and are all identical. Thus, only the first cell 2a is described in detail in FIG. 1. A configurable cell typically comprises a functional circuit connected to the logic circuit 100, and a test input connected to an output of a preceding cell. The test input of the first cell 2a forms the input SRI of the test register to which data that has to be loaded into the test register can be applied. A chaining command signal receives the SCAN_ENABLE signal. A propagation control input receives the signal CLK. An output is connected to the logic circuit 100 and to the test input of following configurable cell. The output of the last configurable cell 2z forms the data output SRO of the test register.

A configurable cell typically comprises a multiplexer 3 and a D flip-flop circuit 4. A first input 31 of the multiplexer 3 forms the functional input of the configurable cells, and the second input 32 of the multiplexer 3 forms the test input of the configurable cells. A selection pad 33 of the multiplexer 3 forms the chaining control input of the configurable cells and enables the selective reproduction of either the state of its first input or the state of its second input at the multiplexer output.

One output of the multiplexer 3 is connected to a data input of the D flip-flop circuit 4. One output 41 of the flip-flop 4 forms the data output of the configurable cell and is connected to the logic circuit 100, and to the second input 32 of the multiplexer 3 of the next configurable cell. The data output 41 of the flip-flop circuit 4 of the last configurable cell 2z forms the output SRO of the test register.

The D flip-flop circuit also has a clock input 42 forming the propagation command input of the configurable cell to receive the data propagation signal. The D flip-flop circuit may be controlled, as the case may be, in a test mode at a test frequency (frequency of the signal CLK) different from the normal working frequency of the circuit 100.

According to the prior art, the pad 33 typically receives a chaining command signal called SCAN_ENABLE given in a known manner by a TAP controller (not shown). As described in the introduction, an internal test is performed on the logic circuit 100 by initially applying a signal SCAN_ENABLE on the pad 33 of the multiplexers. The configurable cells are then all chained together to form a test register. This test register is then loaded with the data applied to its input SRI (which corresponds to the second input 32 of the multiplexer of the first configurable cell 2a)

The loading is clocked by the data propagation signal. The application of the signal SCAN_ENABLE to the pad 33 is then stopped to form a functional circuit in which the configurable cells are connected to the logic cells. The functional circuit performs one or more clock cycles with the loaded data. Then, the signal SCAN_ENABLE is applied again to form the test register. The data recorded in the test register is then read at its output SRO0, which corresponds to the output of the flip-flop circuit 4 of the last configurable cell.

The electronic circuit is particularly protected against attacks by micro-probing. Such an attack may include the application of a command through a micro-probe to the pads 33 so as to form the test register fraudulently while using another micro-probe to record or write data to this test register.

The electronic circuit also comprises a detection circuit 110, a multiplexing circuit 120 and a decoy data generator 130 to propagate decoy data instead of data from the test register if at least some of the configurable cells are not reset during the application of an active chaining command signal.

The detection circuit has the function of detecting the state of a first set of configurable cells, and more specifically, of verifying that the cells of the first set of cells are reset and of producing a corresponding state signal ETAT_INIT. The first set of configurable cells comprises X1 configurable cells. In one example, the X1 cells are chosen randomly from among all the configurable cells. The cells $2d$, $2m$ and $2p$ of FIG. 1 have been chosen randomly.

In another example, only certain configurable cells are considered to be sensitive cells, namely cells that can contain confidential information such as cryptographic keys or personal data while the other cells contain non-sensitive data such as control data. In this case, the X1 cells are preferably chosen from among only the sensitive configurable cells. It is possible to choose all the sensitive cells or only some of them. Thus, in the example of FIG. 2, the cells $2d$ to $2m$ form an internal register in the functional mode and are considered to be sensitive cells of the circuit. The first set of cells comprises the X1 configurable cells $2d$ to $2m$ of the register 20.

3 In the example of FIG. 1, the detection circuit 110 comprises a parallel input to which the outputs of all the cells of the first set of cells are connected, and an output at which the signal ETAT_INIT is produced. The signal is active if at least one of the cells is not in its initial state.

The detection circuit 110 is activated by the signal SCAN_ENABLE. The detection circuit comprises, for example, a comparator comprising a parallel input forming the input of the detection circuit, a reference input to which there is applied a reference value representing the initial state of all the configurable cells of the first set of cells, and an output forming the output of the detection circuit at which the result of the comparison is produced.

In the example of FIG. 2, the detection circuit 210 comprises a control input to which the write signal RW is applied, and an output at which the signal ETAT_INIT is produced. The signal is active if the write signal RW has not been activated since a last operation of writing the initial piece of data DATA0.

The detection circuit 10 is activated by the signal SCAN_ENABLE. In a more general example, the configurable cells of the first set of configurable cells do not receive the chaining command signal SCAN_ENABLE. They are connected to logic cells with which they co-operate to form a logic circuit capable of being reset by an initialization signal. The detection circuit is adapted to producing the state signal ETAT_INIT which is active if the content of the configurable cells of the logic circuit has not been modified since a last activation of the initialization signal.

The multiplexing circuit 120 has the function of selectively connecting the test input of each configurable cell of the second set of X2 cells either to the output of a preceding configurable cell, or to the output of the decoy data generator 130 depending on the state signal ETAT_INIT. In the example of FIG. 1, the second set of cells comprises the cells following the cells of the first set, i.e., in the test register, the cell immediately downstream from each cell of the first set. In the example of FIG. 1, this corresponds to the cells $2e$, $2n$ (not shown) and $2q$.

In the example of FIG. 2, the second set of cells comprises only one cell, more precisely the cell $2n$ following, i.e., situated immediately downstream from the last cell $2m$ forming the internal register 20. Such choices of the second set of cells make it possible, during the propagation of data in the test register, to replace the content of the cells of the first set by decoy data, as shall be seen more clearly below.

The multiplexing circuit 10 naturally depends on the choice of the cells of the second set. The circuit 120 has as many multiplexers as the second set has configurable cells. Each multiplexer has an output connected to the test input of a cell of the second set of cells, a first input connected to the output of the preceding cell, and a second input connected to an output of the decoy data generator 130.

In the example of FIG. 1, the multiplexing circuit 120 has three multiplexers 121, 122, 123. Each multiplexer comprises one output connected to the test input of a cell of the second set of cells (respectively the cells $2e$, $2n$ and $2q$), a first input connected to the output of the preceding cell (respectively the cells $2d$, $2m$ and $2p$), and a second input connected to the output of the decoy data generator 130.

In the example of FIG. 2, the multiplexer circuit has a single multiplexer 220 comprising an output connected to the test input of the cell of the second set of cells (the cell $2n$), a first input connected to the output of the preceding cell (the cell $2m$), and a second input connected to the output of the decoy data generator 130.

The decoy data generator has the function of producing data capable of replacing the contents of the configurable cells, and misleading any fraudulent individual. If the cells of the first set are not properly reset, then they does not permit the formation of the test register. Therefore, they do not permit the discharging of its content. Instead, they replace at least a portion of the data of the cells of the second set of cells by decoy data (i.e., data different from the content before initialization).

The decoy data generator may comprise several outputs to produce different decoy data, and preferably, as many outputs as there are cells in the second set of configurable cells. This is what is shown in FIGS. 1 and 2. In one variation (not shown), the generator comprises only one output to produce a single piece of decoy data applied to the test inputs of all the cells of the second set of cells by way of the multiplexing circuit.

In one example of implementation, the decoy data used includes constant data, equal by choice to a logic 0 or a logic 1. The generator 130 is reduced in this case to a simple connection wire between a supply of the circuit and the input of the multiplexing circuit. This embodiment, however, does not perform very well. A fraudulent individual who might ask for the formation of the test register several times would indeed soon realize that one or more data bits of the test register are identical at each execution, independently of the data input into the register and/or the instructions performed by the functional circuit.

In another example of implementation, the generator 130 is a generator of random numbers (FIG. 1). This embodiment is slightly more efficient than the previous one because the pieces of decoy data produced vary at each formation of the test register.

In yet another example, the decoy data generator is adapted to produce decoy data as a function of the content of the configurable cells. The utility of such a generator is that it produces variable data at each formation of the test generator, and that this data is correlated with the real content of the test register.

According to the embodiment shown in FIG. 2, such a generator 230 (not described in detail) comprises a set of logic gates (OR, AND, XOR, etc.) whose inputs are connected to the outputs of the logic cells of the first set of logic cells. The generator thus produces data at one output. This data is a logic combination of the data contained in the cells of the first set of configurable cells. The output of the generator is connected to the input of the multiplexing circuit 220.

In yet another example, the decoy data generator is adapted to producing decoy data as a function of the contents of the configurable cells and of a cryptographic key which may be, for example, stored in a memory of the electronic circuit. In one embodiment, such a generator may include a computation circuit to implementing a hashing procedure. Hashing is a procedure well known in cryptography for obtaining combining data (in this case, the contents of the cells of the first set of cells) with a cryptographic key. The complexity of the method and of the associated computation circuit generally depends on the expected security level of such a procedure.

The securing method shall now be described in an exemplary implementation in the circuit according to FIG. 1 or FIG. 2. Just as in the case of a prior art securing method, the illustrated method comprises the following steps. A chaining step for setting up, when a chaining command signal SCAN_ENABLE is applied to a chaining command input of the configurable cells, with a connection of the configurable cells to one another in a predefined order by their test input and their output to form a test register. A data propagation step for the output, when a periodic data propagation command signal CLK is applied to a data propagation command input of the configurable cells, of a content of the configurable cells.

When passage of the electronic circuit into a test mode is externally requested, the signal SCAN_ENABLE is applied to a chaining command input of the cells to form the test register. Then, the content of the test register is output and is clocked by the data propagation signal.

The method of the invention also comprises the following steps. A detection step for the production of a state signal ETAT_INIT representing a state of initialization of a first set of configurable cells. A switching step for the connection of the test input of each configurable cell for a second set of configurable cells to an output of a decoy data generator as a function of the state signal.

These two steps are executed in parallel with the propagation step. During the detection step, it is ascertained that the cells are properly reset. If the cells are properly reset, then the test register is formed as in the prior art circuits. If, on the contrary, at least one of the cells of the first set of cells is not properly reset then, the test input of each cell of the second set of cells is connected to an output of the decoy data generator (and no longer to the output of the previous configurable cell).

The test register is thus not properly formed and during the propagation step, decoy data is inserted into the cells of the second set of cells (cells 2e, 2m and 2q of FIG. 1, and cell 2n of FIG. 2), instead of the data contained in the previous configurable cells (cells 2d, 2m, 2p of FIG. 1, and cell 2m of FIG. 2) which are lost.

In one variation, the switching step is executed in parallel with the data propagation step during a period of the data propagation signal CLK, and then a new chaining step is performed. In this variation, a one-bit piece of decoy data is propagated in each cell of the second set of cells for one cycle of the signal CKL. This one-bit piece of decoy data is propagated instead of the contents of the cells situated immediately upstream relative to each cell of the second set of cells. This variation is used, for example, in a circuit according to FIG. 1, in which the cells of the second set of cells are not necessarily successive or side by side in the test register.

In another variation, the switching step is executed in parallel with the data propagation step during several periods of the data propagation signal CLK. Then a new chaining step is performed. Thus, in this variation, several one-bit pieces of decoy data are propagated in each cell of the second set of cells during several cycles of the signal CLK. These one-bit pieces of data are propagated instead of the content of several cells situated immediately upstream relative to each cell of the second set of cells.

This variation is used, for example, in the circuit of FIG. 2, in which several cells of the second set of cells are successive or side-by-side in the test register. Thus, with the circuit of FIG. 2, propagating the switching step during X2 cycles of the signal CLK entails propagating X2 pieces of one-bit data in the cell 2n instead of the contents of the X2 cells 2d to 2m (the contents of the X2 cells 2d to 2m are lost).

The which is claimed:

1. An electronic circuit comprising:
    a plurality of configurable cells including first and second sets of configurable cells, each configurable cell includes a test input and an output, said plurality of configurable cells being coupled to one another in a chain by their test input and their output to form a test register based on receiving a chaining command signal;
    a detection circuit activated by the chaining command signal to generate a state signal representing an initialization state of the first set of configurable cells;
    a decoy data generator to generate data that is separate from data in the test register; and
    a multiplexing circuit for selectively coupling based on the state signal the test inputs of the configurable cells of the second set of configurable cells either to the output of a preceding configurable cell or to an output of said decoy data generator.

2. An electronic circuit according to claim 1, wherein said decoy data generator comprises a random number generator.

3. An electronic circuit according to claim 1, wherein said decoy data generator generates decoy data as a function of data in the preceding configurable cell.

4. An electronic circuit according to claim 3, wherein said decoy data generator further generates the decoy data as a function of a cryptographic key.

5. An electronic circuit according to claim 1, wherein the state signal generated by said detection circuit is active when contents of the first set of configurable cells is equal to an initial value.

6. An electronic circuit according to claim 1, further comprising:
    a logic circuit comprising a plurality of logic cells, and being reset based on receiving an initialization signal;
    each configurable cell of the first set of configurable cells is coupled to said logic circuit when not receiving the chaining command signal; and
    said detection circuit generating an active state signal if contents of said plurality of logic cells have not been modified since a last activation of the initialization signal.

7. An electronic circuit according to claim 1, wherein the first set of configurable cells contains confidential information therein.

8. A smart card comprising:
    a logic circuit;
    a plurality of configurable cells including first and second sets of configurable cells, each configurable cell includes a test input and an output, said plurality of configurable cells being coupled to one another in a chain their test input and their output to form a test register based on receiving a chaining command signal, the first set of configurable cells being coupled to said logic circuit when they do not receive the chaining command signal;
    a detection circuit activated by the chaining command signal to generate a state signal representing an initialization state of the first set of configurable cells;
    a decoy data generator to generate data that is separate from data in the test register; and a multiplexing circuit for selectively coupling based on the state signal the test inputs of the configurable cells of the second set of configurable cells either to the output of a preceding configurable cell or to an output of said decoy data generator.

9. A smart card according to claim 8, wherein said decoy data generator comprises a random number generator.

10. A smart card according to claim 8, wherein said decoy data generator generates decoy data as a function of data in the preceding configurable cell.

11. A smart card according to claim 10, wherein said decoy data generator further generates the decoy data as a function of a cryptographic key.

12. A smart card according to claim 8, wherein the state signal generated by said detection circuit is active when contents of the first set of configurable cells is equal to an initial value.

13. A smart card according to claim 8, wherein said logic circuit is reset based on receiving an initialization signal; said detection circuit generating an active state signal if contents of said plurality of logic cells of said logic circuit have not been modified since a last activation of the initialization signal.

14. A smart card according to claim 8, wherein the first set of configurable cells contains confidential information therein.

15. A method for securing an electronic circuit comprising a plurality of configurable cells including first and second sets of configurable cells, each configurable cell includes a test input and an output, the method comprising:
coupling the plurality of configurable cells to one another in a chain by their test input and their output to form a test register based on receiving a chaining command signal;
activating a detection circuit based on the chaining command signal for generating a state signal representing an initialization state of the first set of configurable cells; and
selectively coupling based on the state signal the test inputs of the configurable cells of the second set of configurable cells either to the output of a preceding configurable cell or to an output of a decoy data generator that generates data that is separate from data in the test register.

16. A method according to claim 15, wherein the decoy data generator comprises a random number generator so that the state signal is randomly generated.

17. A method according to claim 15, wherein the decoy data generator generates decoy data as a function of data in the preceding configurable cell.

18. A method according to claim 17, wherein the decoy data generator further generates the decoy data as a function of a cryptographic key.

19. A method according to claim 15, wherein the state signal generated by the detection circuit is active when contents of the first set of configurable cells is equal to an initial value.

20. A method according to claim 15, wherein the electronic circuit further comprises a logic circuit comprising a plurality of logic cells, and being reset based on receiving an initialization signal, the method further comprising:
coupling each configurable cell of the first set of configurable cells to the logic circuit when not receiving the chaining command signal; and
generating an active state signal if contents of the plurality of logic cells of the logic circuit has not been modified since a last activation of the initialization signal.

21. A method according to claim 15, wherein each configurable cell includes a data propagation command input, the method further comprising providing a data propagation command signal to the data propagation command input of each configurable cell for outputting contents of the plurality of configurable cells.

22. A method according to claim 21, wherein the selectively coupling is performed in parallel with providing the data propagation command signal to the data propagation command inputs of the plurality of configurable cells.

23. A method according to claim 22, further comprising coupling the plurality of configurable cells in a different order after performing the selectively coupling in parallel with providing the data propagation command signal to the data propagation command inputs of the plurality of configurable cells.

* * * * *

UNITED STATES PATENT AND TRADEMARK OFFICE
CERTIFICATE OF CORRECTION

| | | |
|---|---|---|
| PATENT NO. | : 7,930,605 B2 | Page 1 of 1 |
| APPLICATION NO. | : 11/774344 | |
| DATED | : April 19, 2011 | |
| INVENTOR(S) | : Bancel et al. | |

It is certified that error appears in the above-identified patent and that said Letters Patent is hereby corrected as shown below:

Column 3, Line 28    Delete: "circuit i"
                     Insert: --circuit 1--

Column 3, Line 29    Delete: "$2m$,"
                     Insert: --..., $2m$,--

Column 4, Line 14    Delete: "of following"
                     Insert: --of the following--

Column 4, Line 47    Delete: "$2a$)"
                     Insert: --$2a$).--

Column 5, Line 20    Delete: "3"

Column 6, Line 22    Delete: "does"
                     Insert: --do--

Column 7, Line 53    Delete: "CKL"
                     Insert: --CLK--

Signed and Sealed this
Thirtieth Day of August, 2011

David J. Kappos
*Director of the United States Patent and Trademark Office*